United States Patent [19]

Forbord et al.

[11] Patent Number: 5,606,473
[45] Date of Patent: Feb. 25, 1997

[54] UNITARY RIGID AND FLEXIBLE CIRCUIT PACKAGE FOR DISK DRIVES

[75] Inventors: Kent J. Forbord, St. Louis Park; Brian W. Sudman, Eden Prairie; John S. Putnam, Excelsior; Robert J. Nielsen, Eden Prairie, all of Minn.

[73] Assignee: Seagate Technology, Inc., Scotts Valley, Calif.

[21] Appl. No.: 531,395

[22] Filed: Sep. 21, 1995

Related U.S. Application Data

[63] Continuation of Ser. No. 146,316, Nov. 2, 1993, abandoned.

[51] Int. Cl.$^6$ ............................................. G11B 5/12
[52] U.S. Cl. ........................................................ 360/97.01
[58] Field of Search ............................ 360/97.02, 97.01, 360/99.08, 97.03; 361/685, 792

[56] References Cited

U.S. PATENT DOCUMENTS

| | | | |
|---|---|---|---|
| 4,639,863 | 1/1987 | Harrison et al. | 360/97.01 |
| 4,689,110 | 8/1987 | Leibowitz | 361/792 |
| 4,825,316 | 4/1989 | Kishi et al. | 360/97.02 |
| 4,858,044 | 8/1989 | Crapo | 360/99.08 |
| 4,894,738 | 1/1990 | Elsasser et al. | 360/97.1 |
| 4,900,878 | 2/1990 | Ichkhan | 361/792 |
| 4,905,110 | 2/1990 | Krum et al. | 360/99.08 |
| 4,963,697 | 10/1990 | Peterson et al. | 361/792 |
| 4,965,684 | 10/1990 | Stefansky et al. | 360/78.12 |
| 4,965,686 | 10/1990 | Young et al. | 360/98.07 |
| 4,979,062 | 12/1990 | Stefansky et al. | 360/97.02 |
| 5,038,239 | 8/1991 | Vettal et al. | 360/98.01 |
| 5,050,026 | 9/1991 | Goss | 360/106 |
| 5,091,809 | 2/1992 | Connors et al. | 360/99.08 |
| 5,212,607 | 5/1993 | Elsing et al. | 360/99.08 |
| 5,276,572 | 1/1994 | Kinoshita et al. | 360/97.01 |
| 5,282,099 | 1/1994 | Kawagoe et al. | 360/97.01 |
| 5,295,027 | 3/1994 | Elsing et al. | 360/97.01 |
| 5,417,115 | 5/1995 | Burns | 37/778 |

FOREIGN PATENT DOCUMENTS 2336024  7/1977  France ................................. 361/792

*Primary Examiner*—Stuart S. Levy
*Assistant Examiner*—Allen Cao
*Attorney, Agent, or Firm*—Frederick W. Niebuhr, Esq.

[57] ABSTRACT

An electrical circuit package including disk drive operation and control circuitry is formed in multiple layers, including a compliant circuitry layer coextensive with the package, and additional conductive and dielectric layers to form relatively stiff circuit panels bonded to the compliant layer and spaced apart from one another. Portions of the compliant layer, between confronting edges of adjacent circuit panels, provide compliant joinder segments. Each joinder segment electrically couples its associated pair of circuit panels, and structurally couples the panels in a manner that permits a selective, non-coplanar orientation of the panels relative to each other. Thus, the panels are electrically and structurally coupled in a manner that facilitates testing the circuit package as a single unit, followed by installation of the package to a disk drive housing with the circuit panels integral with the housing and in the desired non-coplanar arrangement. The non-coplanar arrangement increases area available for supporting semiconductor components. Selectively arranging the components over the available panel surface area facilitates heat dissipation. Selective shaping and positioning of the panels about the housing enables the housing to accommodate full height actuator and spindle motors.

22 Claims, 4 Drawing Sheets

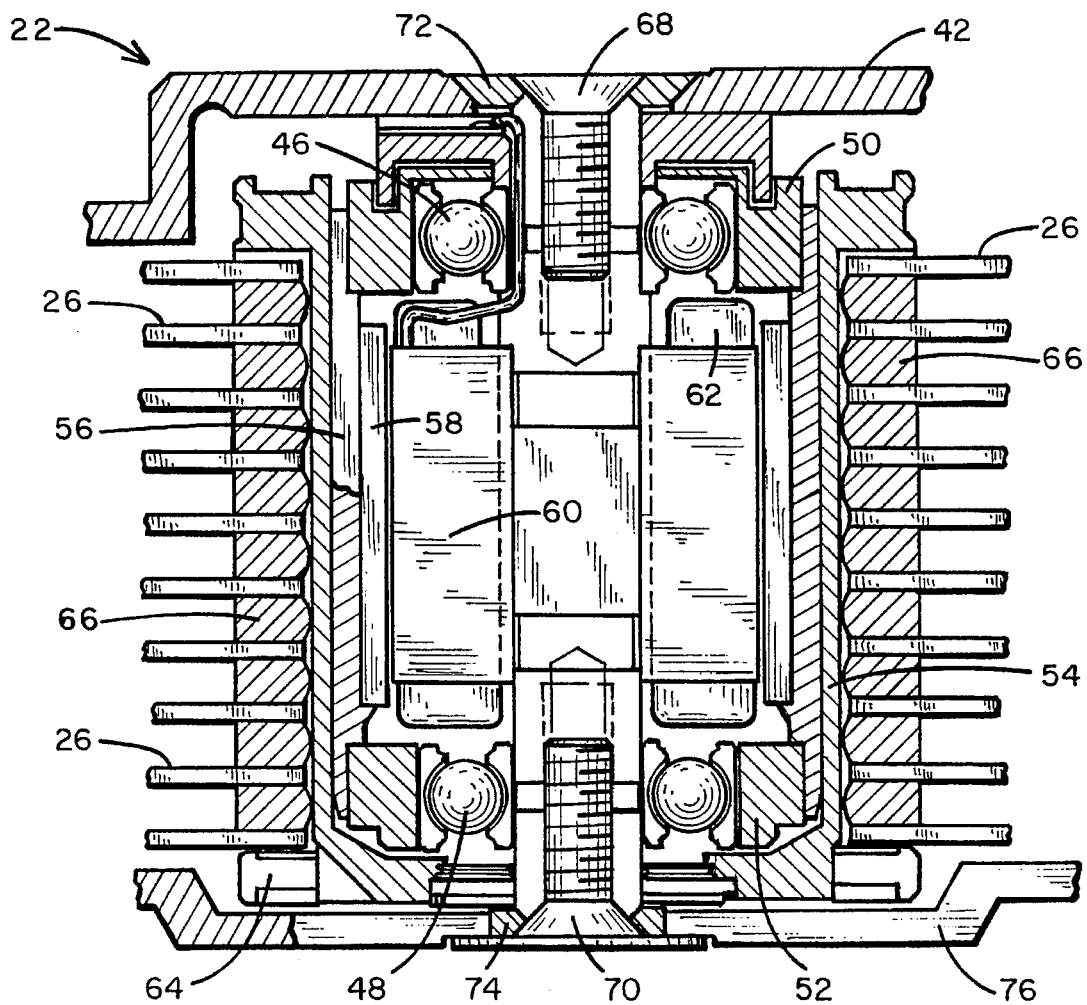
_Fig. 2_
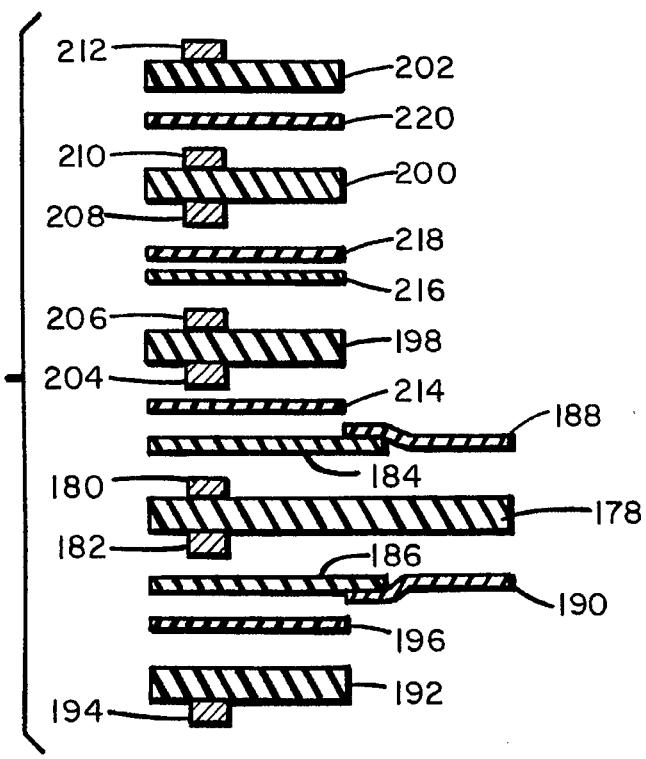
_Fig. 6_

UNITARY RIGID AND FLEXIBLE CIRCUIT PACKAGE FOR DISK DRIVES

This is a continuation of parent application Ser. No. 08/146,316, filed Nov. 2, 1993, now abandoned.

BACKGROUND OF THE INVENTION

The present invention relates to electrical circuitry for controlling disk rotation, actuator pivoting, data writing and data reading operations within disk drives, and more particularly to a space-saving and efficiency-enhancing arrangement of such circuitry.

In the highly competitive disk drive industry, manufacturers continually strive for improved performance along several fronts. Perhaps best known are the ongoing efforts to increase data storage capacity within given size limits, by increasing the density at which bit-encoded data may be stored. Closely related are the attempts to arrange disk drive components to more effectively utilize available space, either to reduce the size of the drive, or to provide a drive of the same size with increased data storage area, improved operating efficiency, or both. Likewise, components are rearranged in order to achieve more effective dissipation of heat, or to prevent certain components from interfering with one another. Cost reduction efforts include substituting less expensive materials in constructing disk drive components and designing systems in a manner to reduce the time required for manufacturing and testing various disk drive subsystems.

The electrical subsystems of disk drives are subject to the above improvement efforts. These subsystems include circuitry for providing power to rotate the data storage disks and the rotary actuator (to control data transducer position), circuitry for handling servo-signals that control transducing head positions, and circuitry for transmitting signals to record or read bit-encoded data. Traditionally, electrical circuitry including discrete integrated circuit components (e.g. semiconductor chips) and conductive electrical circuit paths interconnecting components, have been supported on a single printed circuit card near the bottom of the disk drive. While satisfactory in many respects, this arrangement has given rise to problems in smaller, more compact disk drive designs. One of these is dissipation of the heat generated by the active circuit components, i.e. the components involved with reading and writing operations and with supplying power to the spindle and rotary actuator motors. Another problem is lack of sufficient space for supporting the circuit components on a circuit card sufficiently small for mounting within a downsized disk drive. The circuit card, when mounted within a drive of a given height, occupies space which otherwise might accommodate an axially extended spindle assembly or rotary actuator. This limits disk drive storage capacity and efficiency.

One modification involves mounting the circuit card at the top of the disk drive, rather than the bottom. This can improve heat dissipation from electrical components mounted above the circuit card, but does not satisfactorily address the other problems.

U.S. Pat. No. 5,038,239 (Vettel et al) discloses a circuit arrangement in which several circuit cards are distributed throughout the disk drive, occupying available space near the top of the drive, along certain side walls, and in a stack of three spaced apart cards occupying open space near the actuator. Flexible cables and connectors are employed to electrically interconnect the circuit cards.

This arrangement, however, is subject to difficulties in reliability and manufacturing cost. The connectors impede the establishment and maintenance of reliable electrical interconnections. These connectors, particularly the high pin count, required have a comparatively high failure rate and are more subject to deterioration and damage from shock and vibrations. The arrangement requires installation of several circuit cards instead of just one, e.g. six separate circuit cards as disclosed in the preferred embodiment. After installation the required flexible circuitry must be plugged into connectors mounted on the circuit cards. The individual circuit cards must be separately tested before installation and interconnection. This of course takes more time, and introduces the possibility of failure due to improper interconnection despite the successful testing of the individual circuit cards. All of these factors add significantly to the time and cost of manufacturing.

Therefore, it is an object of the present invention to provide electrical circuitry for controlling and operating a disk drive, including rigid circuit panels attached to one another in a manner that facilitates their mounting in a non-coplanar arrangement, yet structurally and electrically couples the panels without conventional electrical connectors.

Another object is to provide an electrical circuit arrangement for a disk drive that can be tested as a unit in a substantially planar configuration, then installed as a unit and assume a multi-level or multi-orientation configuration.

A further object is to provide a self-contained circuit arrangement with built-in flexible interconnections of substantially rigid electrical circuit panels, to permit flexibility in the positioning and orientation of the panels relative to one another in a manner that improves disk drive operating efficiency and heat dissipation by integrated circuit components supported by the circuit panels.

Yet another object is to provide a rigid and flexible electrical circuit arrangement that lends itself to strategic positioning of integrated circuit components while maintaining accepted industry standard mounting holes and power and interface connectors, and further allowing clearance for "full height" spindle motors and rotary actuator motors.

SUMMARY OF THE INVENTION

To achieve these and other objects, there is provided a disk drive including a rigid and stationery housing, a data storage disk, and a means for supporting the data storage disk inside the housing for rotation relative to the housing about a spindle axis. The drive further includes a transducing head for writing bit-encoded data onto a recording surface of the disk, and for reading bit-encoded data previously stored on the recording surface. An actuator means is provided inside the housing for controllably positioning the transducing head relative to the recording surface. Controlling electrical circuitry controls the rotation of the disk, the positioning of the transducing head and the writing and reading of the bit-encoded data. The control circuitry includes a pliable circuitry layer, several substantially rigid electrical circuit panels, and an adhesive means for bonding the electric circuit panels to the pliable circuitry layer to position the circuit panels spaced apart from one another. The pliable circuitry layer includes a pliable electrically insulative substrate and a plurality of conductive first electrical circuit paths formed on and supported by the pliable substrate. Each electric circuit panel includes an electrically insulative panel substrate and a plurality of conductive second electrical circuit paths formed on and supported by the panel substrate. In each panel a means is provided for electrically coupling at least selected ones of the second circuit paths of the panel with adjacent ones of the first circuit paths of the pliable circuitry layer. Thus, a joinder segment of the pliable circuit layer, disposed between first and second confronting edges of respective first and second adjacent ones of the circuit panels, electrically and structurally couples the first and second panels. The pliable circuitry layer joinder segment portion further is bendable to allow a non-coplanar orientation of the first and second circuit panels relative to one another. A mounting means secures the circuit panels integrally with respect to the housing in the non-coplanar orientation.

Preferably the confronting edges are linear and parallel with the circuitry layer joinder segment bent about an axis parallel to the confronting edges. This permits the joinder segment to be relatively small in length (distance between confronting edges), with its width spanning the majority of the length of the confronting edges. So configured, the joinder segment provides positive structural support of the circuit panels and can accommodate multiple circuit paths between the panels, yet readily conforms to the desired non-coplanarity.

The nature of the non-coplanarity depends on how the joinder segment is folded or bent. For example, a 90 degree bend allows perpendicular mounting of the panels, e.g. one to the top of the housing and another along a side wall of the housing. A 180 degree fold inverts the second panel and positions it parallel to and spaced apart from the first panel. Or, a bend in the form of an S-curve can place the first and second panels in an offset, usually parallel relation. Of course, the width of the joinder segment can be increased to accommodate a desired spacing between the confronting panel edges. The pliable circuitry layer has length and width dimensions greater than its thickness dimension. For example, the length and width each can be at least ten times the thickness. As a result, the joinder segment tends to bend about bending axes that are perpendicular to the thickness dimension.

Preferably the circuitry layer and panels are mounted outside of the disk drive housing to enhance heat dissipation. In one particularly preferred arrangement, the spindle axis and axis of a rotary actuator extend in the direction of the housing height, and the first panel is mounted above a top wall of the housing. The top wall includes a full height region that accommodates the rotary actuator and the spindle assembly, and a recessed region to accommodate the first panel. With the first circuit panel mounted within the top wall recess, the housing can accommodate a full height actuator voice coil motor and a full height spindle motor. This reduces voice coil power dissipation by increasing the active length of the voice coil windings. This also reduces spindle assembly power consumption by reducing spindle motor winding losses due to a taller core lamination stack which allows for longer active lengths. This allows for fewer turns of large gauge or lower resistance wire. In both cases, operating temperatures are reduced for improved efficiency.

The second panel is fixed parallel to an upright side wall of the housing, perpendicular to the first panel. Further, third and fourth circuit panels can be supported beneath the first panel, coupled to one another and to the first panel by joinder sections folded 180 degrees as discussed above.

The major heat dissipating integrated circuit components, i.e. those concerning reading and writing operations and power for the spindle motor and actuator motor, are advantageously mounted above the first panel, and thus dissipate heat away from the housing by convection. Circuit components that dissipate less heat, e.g. digital and analogue servo-components, are mounted on the stacked third and fourth circuit panels. The second panel can accommodate controller circuitry and supports interface and power connections.

If desired, the pliable circuitry layer and the circuit panels can incorporate several conductive layers. For example, in a particularly preferred embodiment the pliable circuitry layer includes first circuit paths applied to two opposite sides of the pliable substrate. A polyimide layer is applied over each conductive layer. This encapsulates the circuit paths, and adds to the strength and flexibility of the pliable circuitry layer in terms of its ability to structurally couple adjacent circuit panels. Further in the preferred embodiment, each of the circuit panels incorporates six additional conductive layers of the second circuit paths or power and ground planes, along with intervening insulative layers of a fiberglass impregnated resin, an insulative adhesive or other appropriate material. The adhesive binds the layers together to structurally rigidify each circuit panel.

A highly preferred housing includes upper and lower housing sections with respective continuous upper and lower side walls. The side walls have respective confronting edges that are joined in sealing relation to close the housing. The respective side walls are upright and, in combination with upright portions of the top wall between the full height region and the recess, lend structural rigidity to the top wall. This permits a thinner top wall construction, whereby more of the disk drive height is available for accommodating the spindle motor and rotary actuator motor. This housing construction also facilitates more rapid assembly of the drive.

Assembly and testing are facilitated by the single unit, multilayer construction of the pliable circuitry layer and circuit panels. In a particularly preferred embodiment, the pliable layer and panels, prior to assembly, can assume a substantially planar configuration in an assembly or testing fixture whereby all of the panels, and the pliable joinder segments interconnecting the panels, can be assembled or tested simultaneously. Following testing, the circuitry layer and panels are installed onto the housing as a unit, considerably reducing installation time and difficulty, as compared to installing multiple, independent circuit cards. Moreover, there is no need to interconnect the circuit cards with flexible circuitry and accompanying connector structures, since panel interconnections are inherent in the integrated pliable circuitry layer. Space formerly required for connectors is available for more complex circuitry or can be left open for improved heat dissipation.

Thus in accordance with the present invention, the electrical circuitry for operating and controlling a disk drive is substantially easier to assemble, test and install, improves heat dissipation and is more reliable due to minimal need for connectors. Flexible interconnections allow non-coplanar positioning of rigid circuit panel elements in a manner that facilitates use of full height spindle motors and rotary actuator motors, and permits desired positioning of interface and power connectors, within strict form factor requirements.

IN THE DRAWINGS

For a further understanding of the above and other features and advantages, reference is made to the following detailed description and to the drawings, in which:

FIG. 2 is a sectional elevation of a spindle assembly of the drive in FIG. 1;

FIG. 6 is an exploded parts view in section of the circuit package;

Figure 1:
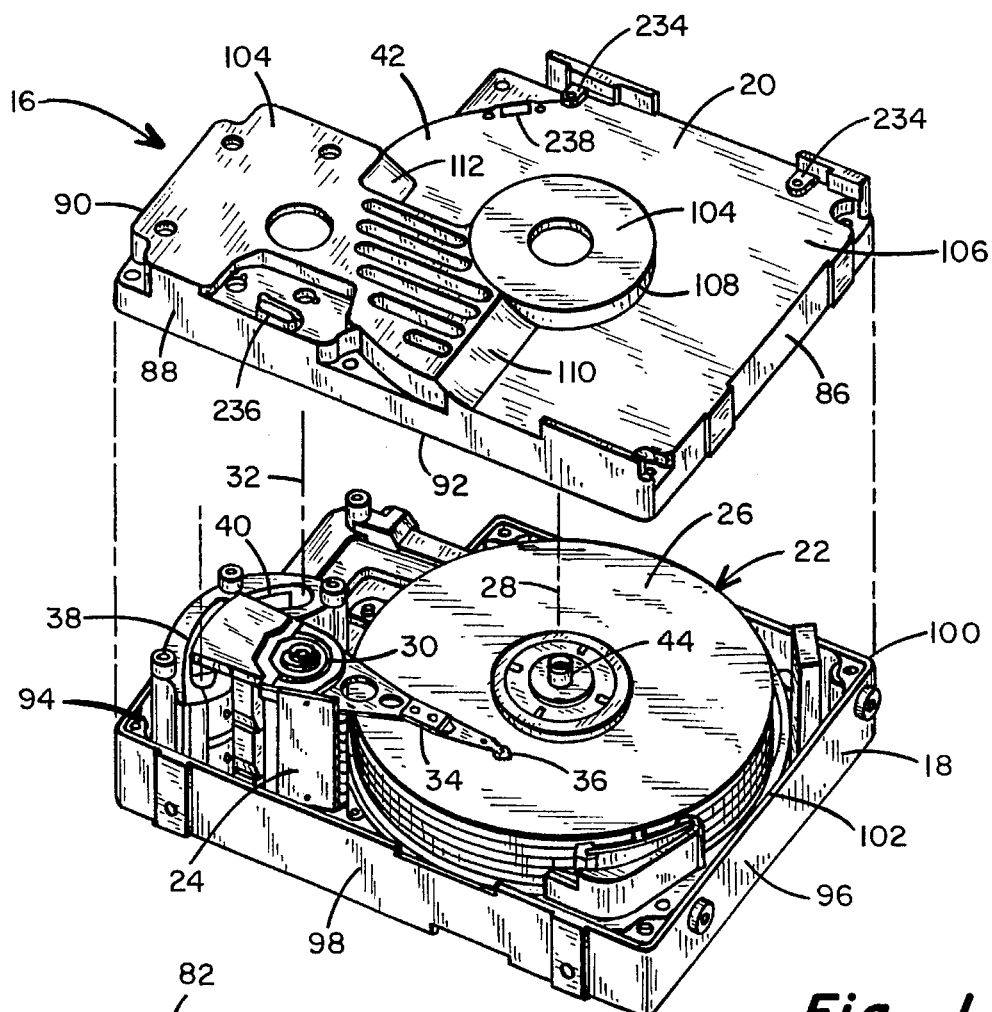
FIG. 1 is a perspective partial view of a magnetic disk drive with a top cover of the drive housing removed to illustrate certain features.
Figure 7:
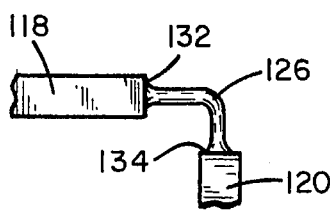
Figure 8:
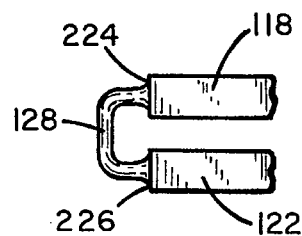
Figure 9:
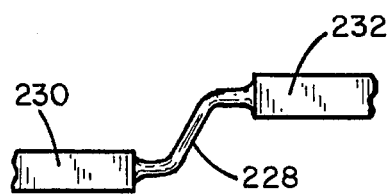
Figure 10:
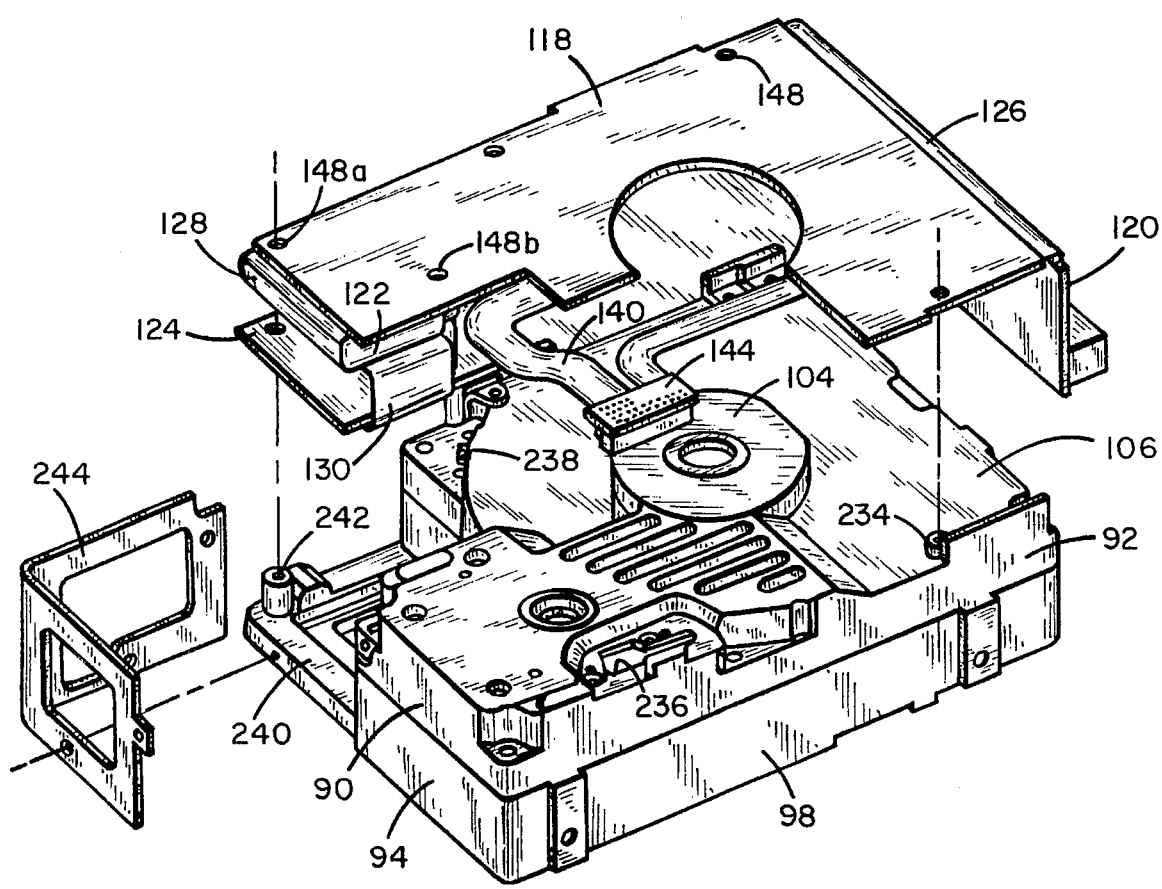

FIGS. 7–9 schematically illustrate alternative configurations of rigid electrical circuit panels supported in noncoplanar orientations by joinder segments of pliable circuitry layers; and FIG. 10 is a perspective view of the disk drive of FIG. 1, showing the drive control circuitry positioned above the drive housing and configured for installation.

DETAILED DESCRIPTION OF THE PREFERRED EMBODIMENT

Turning now to the drawings, there is shown in FIG. 1 part of a magnetic disk drive 16. The disk drive has a rigid outer housing including a deck 18 and a cover 20. Cover 20 is removed from the deck to reveal a disk pack or spindle assembly 22 and a rotary actuator 24, both of which are mounted movably with respect to the housing. More particularly, the spindle assembly includes a top disk 26 and several additional concentrically stacked and spaced apart disks rotatable about a vertical spindle axis 28.

Rotary actuator 24 includes an actuator shaft 30 mounted to pivot relative to the deck about a vertical actuator axis 32. Several transducer support arms, including a top support arm 34 are fixed to rotate with the actuator shaft. Each arm carries a magnetic data transducing head, e.g. a transducing head 36 on support arm 34. The rotary actuator pivots to move the transducing head along arcuate paths generally radially of the disks. Selective actuator pivoting, in combination with controlled rotation of the disks, allows reading and recording of data at any desired location on any one of the disk recording surfaces. Actuator 24 is pivoted by selective application of electrical current to a voice coil 38 supported for arcuate movement within a magnetic field created by a permanent magnet arrangement 40 including several magnets and a pole piece (not illustrated in further detail).

Figure 3:
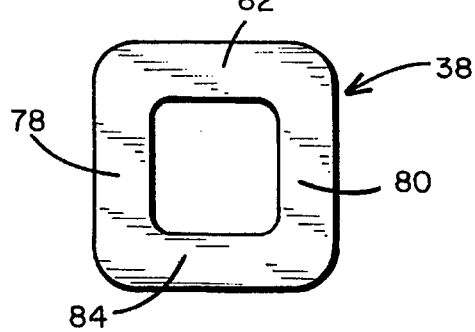
FIG. 3 is an elevation of a voice coil of an actuator assembly of the drive of FIG. 1.

The rotary actuator and spindle assembly are supported between two opposed housing walls, including a top wall 42 of cover 20 and a bottom wall of deck 18. The spindle shaft and actuator shaft are stationery, i.e. integral with the housing, with the disks and support arms being mounted to rotate relative to their respective shafts. FIG. 3 illustrates the rotational mounting of spindle assembly 22 and the fixed mounting of a spindle shaft 44.

Upper and lower bearings 46 and 48 are fixed to spindle shaft 44 along upper and lower end regions of the shaft. Outer races of the bearings are fixed to annular bearing casings 50 and 52, respectively, with the casings in turn fixed to a generally cup-shaped hub 54. An annular back iron 56 is mounted to an annular wall of the hub with an annular magnet arrangement 58 secured to the back iron. The magnet arrangement includes several magnets.

A stator, including an annular arrangement of core laminations 60 and windings 62 is fixed to spindle shaft 44 in a manner to provide a narrow annular gap between the stator and a rotor (which includes a back iron and magnets). In a known manner, an electrical current is supplied to stator windings 62 to generate a magnetic field about the stator. The resulting magnetic field, in combination with the magnetic fields of the magnet arrangement, applies the necessary force to rotate the disks. A clamping ring 64 and several spacer rings 66 maintain disks 26 integral with the hub and axially spaced apart from one another. Fasteners 68 and 70, threaded into the respective end regions, cooperate with alignment rings 72 and 74 to secure spindle shaft 44 integrally to top wall 42 and a bottom wall 76.

The vertical distance between top wall 42 and bottom wall 76 is one of several dimensions subject to maximum values considered acceptable throughout the industry for particular types of disk drives. Further, there are requirements as to the positioning of certain features for interconnections to the environment outside of the disk drive, such as the interface connection, power connection and certain mechanical connection points. Collectively, these values determine as what is known as a "form factor" of the particular drive. For example, for the 3½ inch diameter rigid disk drive, the form factor defines a maximum height of about 1⅝ inches, a width of about 4 inches and a length of about 5¾ inches for a rectangular drive. Further according to the form factor, the power and interface connections are mounted along a lower portion of one of the housing walls, particularly a rear wall.

FIG. 3 illustrates voice coil 38 of the rotary actuator. Voice coil 38 is a continuous winding of an electrically conductive wire. While the winding is continuous, coil 38 is conveniently considered to include a pair of opposed vertical segments 78 and 80, and an opposed pair of horizontal segments 82 and 84 joined to the vertical segments. Vertical segments 78 and 80 are the active segments, in the sense that when conducting an electrical current they generate a magnetic field that interacts with the field of the permanent magnet arrangement to pivot the rotary actuator. The magnetic fields generated by horizontal segments 82 and 84 do not contribute to the motive force, but are necessary to complete the electrically conductive path of the coil. Thus, the efficiency of coil 38 can be increased by increasing the active length of the windings, which is possible with a taller coil.

The efficiency of the spindle motor rotor can be improved by increasing the height dimension of core laminations 60 which allows for longer active length of the motor windings. Thus, the available disk drive height, i.e. the form factor of 1⅝ inches, has an impact on spindle assembly and rotary actuator efficiency. It is advantageous to reserve as much of the available height as possible, to accommodate these components.

According to one aspect of the present invention, deck 18 and cover 20 are constructed to increase the available height by enabling top wall 42 and bottom wall 76 to be relatively thin. More particularly, as best seen in FIG. 1, cover 20 includes a vertical, continuous side wall structure including a rearward wall 86, side wall 88, forward wall 90 (FIG. 10) including an arcuate portion conforming to the spindle assembly, and an opposite side wall not visible in the figures.

The upper side wall structure includes a flat, horizontal continuous bottom edge 92.

Deck 18 includes an upright side wall structure including a forward wall 94, a rearward wall 96, and two opposed side walls, one of which is shown at 98. These walls combine to provide a continuous, horizontal top edge 100. An elastomeric seal 102 is mounted to top edge 100. When cover 20 is assembled onto deck 18, e.g. by several fasteners (not shown) threaded into internally threaded openings of the deck, confronting bottom edge 92 and top edge 100 are brought into sealing engagement to close the housing about the spindle assembly and rotary actuator.

The upper and lower side walls are relatively thick to lend axial rigidity to the housing. Further, top wall 42 is formed with a horizontal full height region 104, a horizontal recessed region 106 interconnected by several non-horizontal regions as indicated at 108, 110 and 112. The full height region accommodates the rotary actuator and spindle assembly. The non-horizontal regions provide additional stiffness to top wall 42, which strengthens the wall and enables a reduced thickness wall construction. This increases the height available to accommodate the rotary actuator and spindle assembly.

Figure 4:
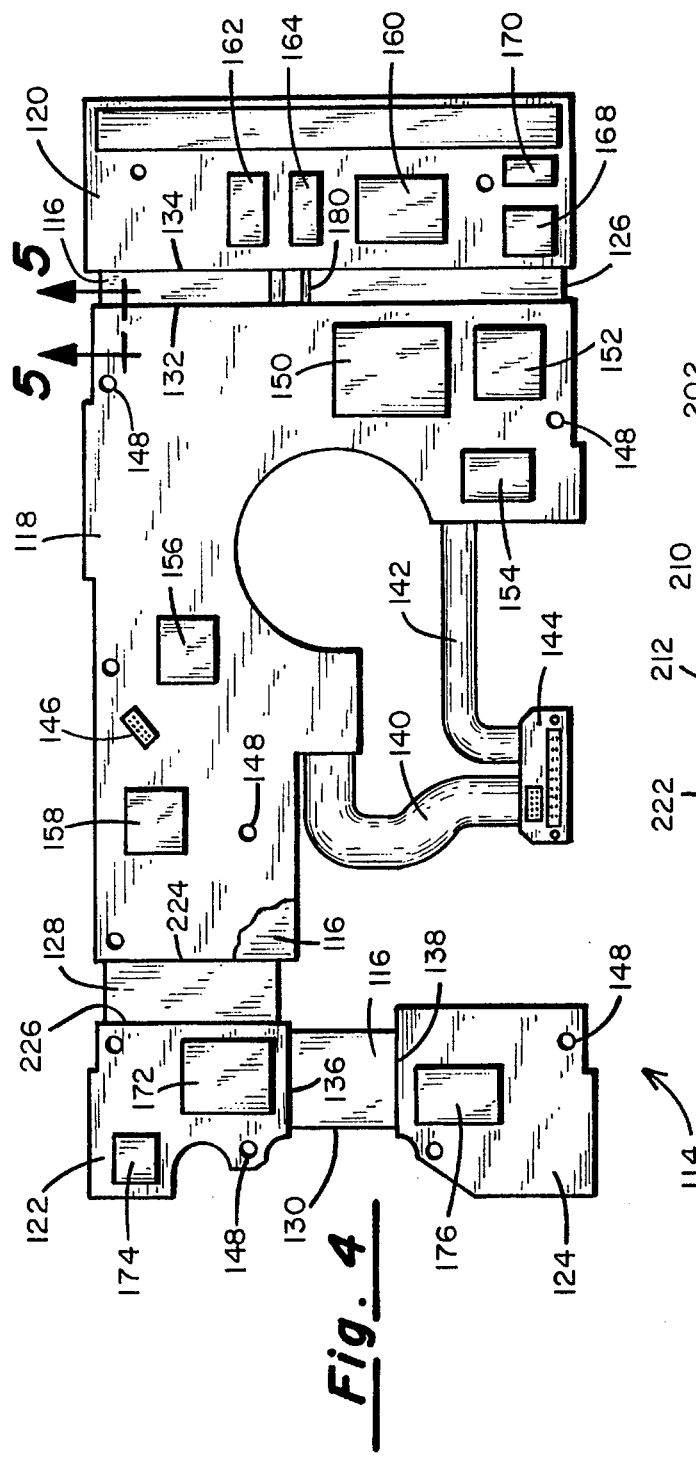
FIG. 4 is a top plan view of an electrical circuit package for controlling the drive, constructed in accordance with the present invention.

FIG. 4 illustrates a unitary electrical circuit package 114 which incorporates circuitry for operating and controlling disk drive 16. Circuit package 114 is of multi-layer construction, including a pliable circuitry layer 116 and several panels indicated respectively at 118, 120, 122 and 124. The panels are formed by selectively applying additional conductive and insulative layers to pliable circuitry layer 116. Each of the panels is sufficiently rigid to resist any appreciable bending. Between pairs of adjacent panels, pliable circuitry layer 116 provides joinder segments that electrically and structurally couple the panels. More particularly, the pliable circuitry layer provides a joinder segment 126 between panels 118 and 120, a joinder segment 128 between panels 118 and 122, and a joinder segment 130 between panels 122 and 124.

Considering joinder segment 126 in greater detail, this segment has a width that runs substantially the entire lengths of confronting edges 132 and 134 of panels 118 and 120, respectively. The length of joinder segment 126 (from edge 132 to edge 134) is substantially less than its width. At the same time, the segment length is substantially more than its thickness, to enable bending or folding of the segment about an axis parallel to confronting edges 132 and 134. Joinder segments 128 and 130 are substantially similar, although the width of segment 130 along confronting panel edges 136 and 138 is less than the length from one confronting edge to the other.

Pliable circuitry layer 116 further includes a pair of elongate joinder segments 140 and 142 between panel 118 and a substantially rigid socket connector 144. Connector 144 electrically couples circuit package 114 to circuitry within the housing, in particular circuitry to operate the rotary actuator and read/write circuitry. Another socket connector 146 is incorporated into circuit panel 118 for electrically coupling circuit package 114 to spindle motor drive circuitry within the housing.

A series of openings 148 formed through the panels facilitate mounting of the circuit package panels to the housing and with respect to one another.

A variety of integrated circuit components, principally in the form of semiconductor chips, are mounted to the circuit panels. For example, circuit panel 118 supports a detector (read) component 150, a writer component 152 and a read/write filter component 154. This circuit panel also supports various motor power circuits including a spindle motor component 156 and a voice coil motor component 158. Circuit panel 120 supports an SCC (SCSI controller chip) component 160, dynamic random access memory chips 162 and 164, and transceiver chips 168 and 170.

Panel 122 supports a digital signal processor 172 and an analog/digital converter component 174 and a digital servo ASIC (opposite side) of the panel. Servo-analogue circuitry including a servo-analogue decode component 176 is mounted to circuit panel 124.

Figure 5:
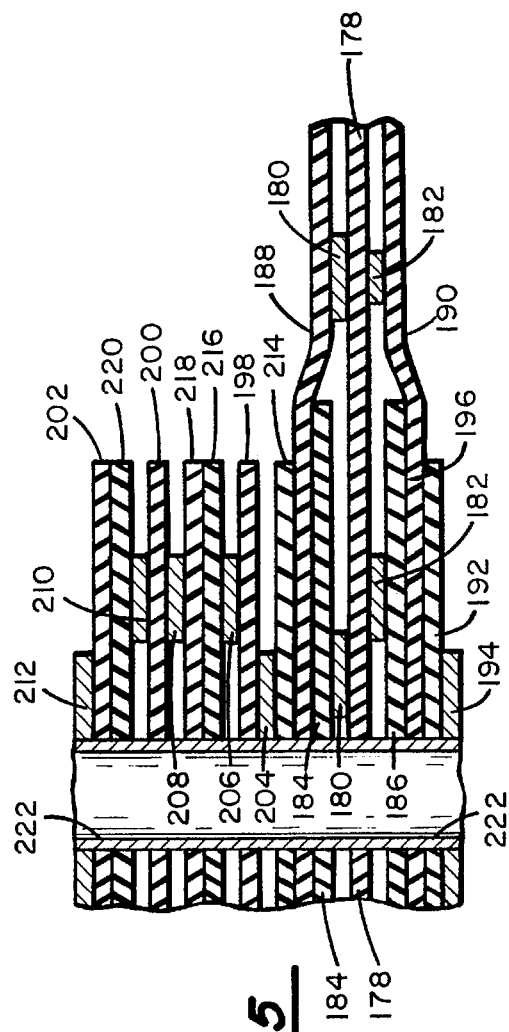
FIG. 5 is a partial sectional view of FIG. 4 taken along the line 5—5 in FIG. 4.

The multilayer construction of circuit package 114 is best understood from FIG. 5. Pliable circuitry layer 116 includes a compliant substrate 178, preferably of a fiberglass impregnated epoxy resin. As indicated at 180 and 182, patterns of circuit paths can be formed on both sides of substrate 178. The compliant layer, including substrate 178 and circuit paths 180 and 182, is continuous throughout substantially all of the package structure. The circuit paths are covered by electrically insulative layers, and thus are dielectrically encapsulated. More particularly, respective insulative adhesive layers 184 and 186 are applied in regions of the circuit panels. In the interpanel joinder regions, the conductors (preferably rolled, annealed copper) are covered by respective compliant insulative layers 188 and 190, preferably polyimide.

The remaining layers of circuitry and dielectric material are applied only in the circuit panel regions. These include a panel substrate 192 and a circuit path 194 beneath the compliant circuitry layer, and an adhesive film 196 between substrate 192 and insulative adhesive layer 186. Layers above the compliant circuitry layer include panel substrates 198, 200 and 202 and circuit paths 204 and 206 on opposite sides of substrate 198; circuit paths 208 and 210 on opposite sides of substrate 200, and a circuit path 212 on substrate 202. Adhesive layers 214, 216, 218 and 220 integrally secure these substrates to one another and with respect to the compliant circuitry layer. The pair of layers 216 and 218 provide more effective insulation between circuit paths 208 and 210.

As seen in FIG. 5, a plated through-hole 222 is formed through panel 118 to electrically couple selective circuit paths from the various layers. In a known manner, plated through-hole 222 and other plated through-holes can be selectively positioned to electrically couple selected circuits from the various conductive layers.

As seen in FIG. 4, circuit paths 180 can conveniently run perpendicular to the confronting edges of adjacent panels, to effect numerous and relatively short interpanel electrical connections. Each joinder segment, in running substantially the length of its associated confronting panel edges, provides positive structural support to the panels and ample length for multiple electrical interconnection paths. Because these conductive paths are part of a single compliant layer structure integrated into the multilayer package, no connectors are required for the necessary electrical connections among the panels. Thus, the number of conductive paths from one panel to another is not limited by the need to accommodate any connector structure.

Circuit package 114 readily assumes the planar configuration illustrated in FIG. 4. However, the circuit package also can assume a variety of configurations in which the panels are oriented and positioned in non-coplanar relation to one another. A variety of relative panel orientations is obtained, depending on how the compliant joinder region between adjacent panels is bent or folded. For example, in FIG. 7 joinder segment 126 is bent approximately 90 degrees about an axis parallel to confronting edges 132 and 134, to orient circuit panel 120 perpendicular to circuit panel 118. In FIG. 8, joinder segment 128 is bent or folded 180 degrees about an axis parallel to confronting edges 224 and 226, to invert circuit panel 122 and position it in parallel, vertically spaced apart relation to circuit panel 118.

In FIG. 9, a compliant joinder segment 228 is bent into an S-curve to position adjacent circuit panels 230 and 232 in vertically spaced apart relation, and also to provide a desired horizontal offset of panel 232 relative to panel 230. Accordingly, circuit package 114 and other packages can be configured according to the present invention, to provide for virtually any desired configuration of panels selectively positioned and oriented with respect to one another.

FIG. 10 illustrates circuit package 114 vertically spaced apart from cover 20 but with its circuit panels positioned and oriented for installation to the housing. Several features of the housing facilitate circuit package installation, e.g. several bosses 234 which position panel 118 above and vertically spaced apart from recessed region 106 of the top wall. Formed through each boss and extending below the boss is an opening, internally threaded to receive a fastener that secures the circuit panel. An opening 236 through cover 20 conforms to the profile of socket connector 144 and receives the connector for releasable coupling to a complementary connector mounted inside the housing. Similarly, an opening 238 receives socket connector 146.

A frame member 240, integral with deck 18, includes a post 242 for supporting circuit panel 124. Similar posts (not shown) are supported between panel 124 and panel 122, and between panel 122 and panel 118, held in place by a fastener inserted downwardly through opening 148a. A similar arrangement of columns is held by a fastener inserted through opening 148b, to further support panels 118, 122 and 124. Corner plate 244 is fastened to deck 18 after the panels are secured.

As seen in FIG. 10, compliant joinder segments 126, 128 and 130 are bent to position the panels in non-coplanar relation, with panel 118 as a top panel, panel 120 as a vertically disposed rearward edge panel, and panels 122 and 124 stacked below top panel 118. Top panel 118 is selectively shaped for alignment with recessed region 106 of the top wall. Accordingly, while bosses 234 support the top panel vertically spaced apart from and above recessed region 106, the top panel does not exceed the height of full height region 104 of the cover. Consequently, the full height of the housing is available to accommodate the spindle motor and the rotary actuator voice coil for maximum height and therefore maximum efficiency of these components. The integrated circuit components that generate the most heat, i.e. the read/write components and the voice coil motor and spindle motor components, are mounted above top panel 118, to dissipate heat by convection in directions away from the housing. Less power intensive components are mounted on rearward edge panel 120. Other components not requiring much cooling, i.e. the digital and analogue servoprocessor and other components, are mounted on stacked panels 122 and 124. This selective arrangement results in more effective heat dissipation.

Heat dissipation also is enhanced because the panels in combination provide increased surface area for supporting integrated circuit components. More particularly, there is approximately 15% additional surface area as compared to a single circuit card mounted over the entire top or bottom of a similarly sized disk drive. The added surface area permits more space between the heat-generating circuit components and enables more complex circuit components to be incorporated into the package due to more efficient heat dissipation.

The continuity of compliant circuitry layer 116 enables handling circuit package 114 as a single unit, which facilitates installation and testing prior to installation. More particularly, a generally planar test fixture (not shown) can be constructed to accommodate circuit package 114, to considerably simplify testing procedures. Testing is more reliable, because all circuit panel interconnections are in place and subject to testing before the circuit package is installed. Moreover, it can be appreciated that installation of circuit package 114 is more convenient and takes less time than a comparable installation of several independent circuit cards followed by a plugging of various connectors to electrically interconnect the separate cards. Installation is aided by the compliant joinder segments, which maintain the panels together as a single unit, and support the panels relative to one another in a manner that tends to guide and position remaining panels near their intended points of mounting once one of the panels (e.g. top panel 118) is secured.

Thus in accordance with the present invention, disk drive operating and controlling circuitry is easily assembled onto a disk drive housing despite involving several panels at different, non-coplanar orientations and locations. Electrical connections among the panels are more reliable, as they are integrated into the multilayer circuit package structure and therefore require no connectors. Various discrete semiconductor components are supported by the panels in an arrangement selected for effective heat dissipation. Heat dissipation is further improved by the additional surface area available for supporting these components. The circuit panels are selectively shaped and positioned about the housing to accommodate full height, more efficient rotary actuator and spindle motors.

What is claimed is:

1. In a data storage device having a rigid housing, a data storage medium inside of the housing, a means for supporting the data storage medium for movement relative to the housing, a data transducer located inside the housing to interact with the data storage medium for reading bit-encoded data stored on the medium or recording bit-encoded data onto the medium: an electrical control circuit for controlling said interaction, said electrical control circuit including:

a pliable electrically insulative substrate and a first electrical circuit layer formed on and supported by the pliable substrate;

a plurality of substantially rigid electrical circuit panels, each electrical circuit panel including a substantially rigid and planar electrically insulative panel substrate and a second electrical circuit layer formed on and supported by the panel substrate, and an electrically insulative adhesive bonding the rigid panel substrates to the pliable substrate and thereby maintaining the rigid panel substrates in spaced apart relation to one another, with each respective one of the second electrical circuit layers separated spatially and electrically from the first electrical circuit layer by a substantially planar first electrically insulative layer formed of said adhesive, wherein the second electrical circuit layer and the first electrical circuit layer are on opposite sides of the first insulative layer, and the first insulative layer is substantially parallel to the rigid panel substrate; and an electrically conductive coupling means extending through each of the first insulative layers in a direction substantially normal to the planes of the associated first insulative layer and rigid panel substrate, for selectively electrically coupling the second electrical circuit layers with the first electrical circuit layer;

wherein a portion of the pliable substrate and the first circuit layer, disposed between first and second confronting edges of respective first and second adjacent ones of said electrical circuit panels, provides a joinder segment that mechanically couples the first and second electrical circuit panels and enables an electrical coupling of the respective second electrical circuit layers of the first and second electrical circuit panels, said joinder segment being bendable to allow a non-coplanar orientation of the first and second electrical circuit panels relative to one another.

2. The electrical control circuit of claim 1 wherein:

each of the electrical circuit panels is of multilayer construction and includes a third electrical circuit layer and a second insulative layer between the second electrical circuit layer and the third electrical circuit layer; and wherein said coupling means extends through the second electrically insulative layer in said direction to electrically couple the third electrical circuit layer with the second electrical circuit layer and the first electrical circuit layer.

3. The electrical control circuit of claim 1 further including:

a means for securing the electrical circuit panels integrally with respect to the housing in said non-coplanar orientation.

4. A disk drive including:

a rigid and stationary housing;

a data storage disk and means for supporting the data storage disk inside the housing for rotation relative to the housing about a spindle axis;

a data transducing head for writing bit-encoded data onto a recording surface of the disk and reading bit-encoded data previously stored on the recording surface, and an actuator means inside the housing for variably positioning the transducing head relative to the recording surface;

means for controlling the rotation of the disk, the positioning of the transducing head and the writing and reading of the bit-encoded data, including:

(a) an electrically insulative, pliable substrate, and a first circuit layer formed on the pliable substrate and supported by the pliable substrate;

(b) a plurality of electrically insulative, substantially rigid panel substrates, and a second circuit layer formed on each of the rigid panel substrates and supported by its associated rigid panel substrate;

(c) an electrically insulative adhesive means bonding each of the rigid panel substrates with respect to the pliable substrate, and forming an insulative adhesive layer between the first circuit layer and each of the second circuit layers to electrically separate the first circuit layer from the second circuit layers, said adhesive means further fixing at least first and second ones of the rigid panel substrates in spaced apart relation to provide a joinder segment comprised of the pliable substrate and the first circuit layer extending between the first and second rigid panel substrates, said joinder segment being bendable to alternatively allow: (i) a planar orientation in which the pliable substrate, the rigid panel substrates, the first circuit layer and the second circuit layer are substantially planar and occupy respective parallel planes; and (ii) a non-coplanar orientation of the first and second rigid panel substrates relative to one another that positions the pliable substrate in more than one plane; and (d) a plurality of selectively positioned electrical conductors including at least one of the electrical conductors coupled to each of the second circuit layers and extended substantially normal to said parallel planes through the insulative adhesive layer to the first circuit layer, to form a selective electrical coupling of the associated second circuit layer and the first circuit layer; and a means for securing the rigid panel substrates integrally with respect to the housing in said non-coplanar orientation.

5. The disk drive of claim 4 wherein:

the joinder segment tends to bend about a bend axis parallel to said parallel planes and perpendicular to a thickness of the pliable substrate and the first circuit layer.

6. The disk drive of claim 5 wherein:

said bending is approximately 90 degrees, and orients the second rigid panel substrate substantially perpendicular to the first rigid panel substrate.

7. The disk drive of claim 5 wherein:

said bending is approximately 180 degrees, and positions the second rigid panel substrate in spaced apart and substantially parallel relation to the first rigid panel substrate.

8. The disk drive of claim 5 wherein:

said bending is in the form of an S curve and positions the second rigid panel substrate in parallel, spaced apart and offset relation to the first rigid panel substrate.

9. The disk drive of claim 5 wherein:

the first and second rigid panel substrates have respective first and second confronting edges that are substantially linear and parallel to the bend axis.

10. The disk drive of claim 9 wherein:

said joinder segment is extended along substantially the entire length of the first and second confronting edges.

11. The disk drive of claim 5 wherein:

said pliable substrate has first and second substantially planar and parallel opposite sides, said first circuit layer is formed on the first side of the pliable substrate, and the controlling means further includes a third electrical circuit layer formed on said second and opposite side of the pliable substrate.

12. The disk drive of claim 4 further including:

a first pliable dielectric covering layer cooperating with the pliable substrate to dielectrically encapsulate the first circuit layer.

13. The disk drive of claim 4 further including:

a first dielectric covering cooperating with the pliable substrate to encapsulate the first circuit layer, and a second dielectric covering cooperating with the rigid panel substrates to encapsulate the second circuit layers.

14. The disk drive of claim 4 further including:

spindle circuitry inside of the housing for controlling the rotation of the disc, actuator circuitry inside of the housing for controlling movement of the transducing head, and a connector means extended through the housing to electrically couple the first and second circuit layers with the spindle circuitry and the actuator circuitry;

wherein the pliable substrate, the first circuit layer, the second circuit layer and the rigid panel substrates are disposed outside of the housing.

15. The disk drive of claim 14 wherein:

said housing is generally rectangular and has a length, a width and a height, the spindle axis is parallel to the height, and said actuator means moves the transducing head in an arcuate path about a rotary actuator axis parallel to the height; and wherein said housing has a top wall including a full height portion proximate the spindle axis and the actuator axis, and a reduced height portion remote from the spindle and actuator axes to form a recess, and wherein said first rigid panel substrate is mounted along and substantially parallel to the reduced height portion of the top wall and within said recess.

16. The disk drive of claim 15 wherein:

the housing includes an upper housing section and a lower housing section, each of the upper and lower sections including a continuous upper and lower side wall means respectively, with respective upper and lower continuous edges releasably coupled to one another in sealing relation.

17. The disk drive of claim 16 wherein:

the second rigid panel substrate is coupled to the side wall means and is substantially perpendicular to the first rigid panel substrate.

18. The disk drive of claim 17 including:

framework adjacent and integral with the housing to define an open region adjacent to and outside of the housing; wherein part of the first rigid panel substrate extends away from the housing and into the open region; and wherein the control means further include a third rigid panel substrate disposed within the open region in parallel, spaced apart relation beneath the first rigid panel substrate.

19. The disk drive of claim 18 further including:

first, second and third sets of discrete semiconductor integrated circuit components mounted on the first, second and third rigid panel substrates, respectively.

20. The disk drive of claim 19 wherein:

said first set of semiconductor components includes read/write circuitry and circuitry for providing power to rotate the disk and rotate the transducing head, the second set of semiconductor components includes controller circuitry and the third set of semiconductor components includes servo-analogue circuitry, servo-digital circuitry and servo-processing circuitry.

21. The disk drive of claim 20 wherein:

said first group of semiconductor components are mounted above the first panel substrate.

22. The disk drive of claim 4 wherein:

the control means includes a third circuit layer integral with each of the rigid panel substrates, and insulative means for electrically isolating the third circuit layer from the second circuit layer; and wherein the electrical conductors include plated through holes formed through each rigid panel substrate, the adjacent insulative adhesive layer and the adjacent insulative means, to electrically couple the first, second and third circuit layers.

\* \* \* \* \*